(12) United States Patent
Richardson et al.

(10) Patent No.: US 10,264,688 B2
(45) Date of Patent: Apr. 16, 2019

(54) EARTHING ARRANGEMENT FOR ELECTRICAL PANEL

(71) Applicant: ROLLS-ROYCE PLC, London (GB)

(72) Inventors: John Philip Richardson, Derby (GB); Paul Broughton, Leicester (GB)

(73) Assignee: ROLLS-ROYCE plc, London (GB)

( * ) Notice: Subject to any disclaimer, the term of this patent is extended or adjusted under 35 U.S.C. 154(b) by 884 days.

(21) Appl. No.: 14/825,774

(22) Filed: Aug. 13, 2015

(65) Prior Publication Data

US 2016/0057873 A1 Feb. 25, 2016

(30) Foreign Application Priority Data

Aug. 22, 2014 (GB) .................................. 1414963.7

(51) Int. Cl.
| | |
|---|---|
| H05K 5/00 | (2006.01) |
| H05K 1/02 | (2006.01) |
| G01R 29/08 | (2006.01) |
| H01R 13/648 | (2006.01) |
| H05K 1/18 | (2006.01) |

(52) U.S. Cl.
CPC ....... *H05K 5/0026* (2013.01); *G01R 29/0835* (2013.01); *H01R 13/648* (2013.01); *H05K 1/028* (2013.01); *H05K 1/0216* (2013.01); *H05K 1/0218* (2013.01); *H05K 1/189* (2013.01); *H05K 2201/0723* (2013.01); *H05K 2201/10189* (2013.01)

(58) Field of Classification Search
CPC .......... H05K 5/00; H05K 1/02; H05K 1/0216; H05K 1/028

USPC ........ 361/600–626, 775, 830, 760, 816, 818
See application file for complete search history.

(56) References Cited

U.S. PATENT DOCUMENTS

| | | | | |
|---|---|---|---|---|
| 4,076,379 A | * | 2/1978 | Chouinard | ........... G02B 6/3807 385/73 |
| 2007/0149008 A1 | * | 6/2007 | Pabst | ..................... H01R 12/68 439/95 |
| 2010/0289706 A1 | | 11/2010 | Hsieh et al. | |
| 2011/0120748 A1 | * | 5/2011 | Bailey | .................. H01B 7/0838 174/117 F |
| 2012/0305014 A1 | * | 12/2012 | Richardson | .............. A24D 1/02 131/284 |

(Continued)

FOREIGN PATENT DOCUMENTS

| | | |
|---|---|---|
| EP | 0 835 045 A2 | 4/1998 |
| EP | 2590486 A1 | 5/2013 |

(Continued)

OTHER PUBLICATIONS

Jan. 21, 2016 Search Report issued in European Patent Application No. 15 18 0860.

(Continued)

*Primary Examiner* — Tuan T Dinh
(74) *Attorney, Agent, or Firm* — Oliff PLC (57) ABSTRACT

A rigid electrical panel has both a flexible printed circuit and an electromagnetic protection layer embedded therein. The flexible printed circuit has an integral electromagnetic shield. The integral electromagnetic shield and the electromagnetic protection layer are electrically isolated, so as to provide independent grounding paths. The independent grounding paths are individually tested for safe operation.

15 Claims, 4 Drawing Sheets

(56) References Cited

U.S. PATENT DOCUMENTS

| | | | |
|---|---|---|---|
| 2013/0160461 A1* | 6/2013 | Broughton | F02C 7/12 60/796 |
| 2013/0293997 A1 | 11/2013 | Tollefsbol et al. | |
| 2013/0343020 A1 | 12/2013 | He et al. | |

FOREIGN PATENT DOCUMENTS

| | | |
|---|---|---|
| EP | 2 607 659 A2 | 6/2013 |
| EP | 2 607 660 A2 | 6/2013 |
| EP | 2 607 666 A2 | 6/2013 |
| EP | 2 743 477 A1 | 6/2014 |
| EP | 2799476 A1 | 11/2014 |
| EP | 2800207 A2 | 11/2014 |
| GB | 2 272 107 A | 5/1994 |
| JP | 2005109101 A | 4/2005 |
| JP | 2006-019345 A | 1/2006 |
| JP | 2006-229157 A | 8/2006 |

OTHER PUBLICATIONS

Feb. 20, 2015 Search Report issued in British Patent Application No. GB1414963.7.

\* cited by examiner

EARTHING ARRANGEMENT FOR ELECTRICAL PANEL

CROSS-REFERENCE TO RELATED APPLICATIONS

This application is based upon and claims the benefit of priority from British Patent Application Number 1414963.7 filed 22 Aug. 2014, the entire contents of which are incorporated by reference.

BACKGROUND

1. Field of the Disclosure

The present disclosure relates to an electrical system, for example an electrical system of a gas turbine engine.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

Figure 1:
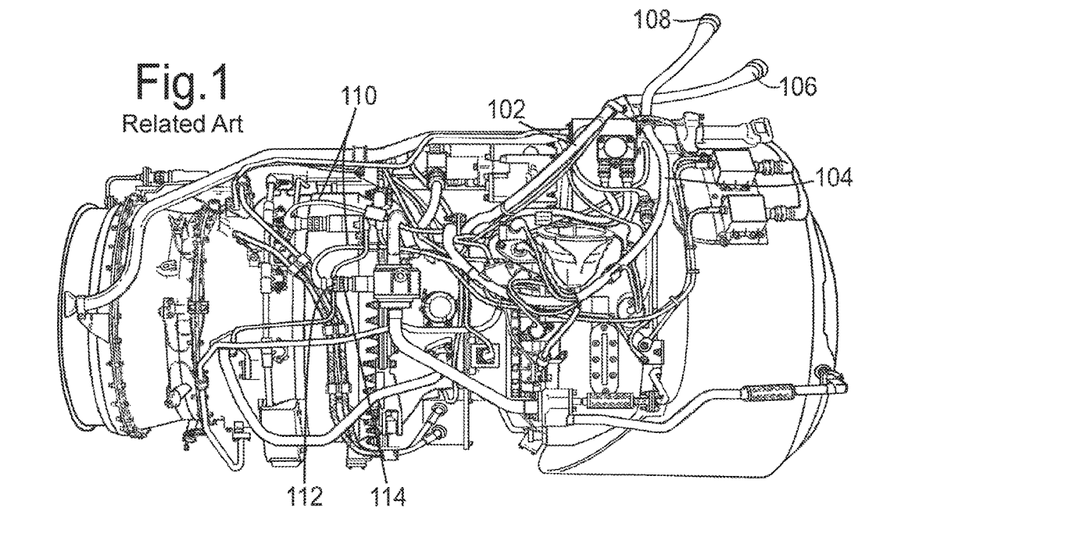
FIG. 1 shows a gas turbine engine with a conventional harness.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

Objects and Summary

It has been proposed to embed electrical conductors of an electrical system of a gas turbine engine into an electrical panel, or raft. This may alleviate at least some of the problems outlined above. However, it is important for the electrical conductors to be properly protected from electromagnetic surges or spikes, such as those generated by a lightning strike. It is also important to be able to properly and reliably test that the electromagnetic protection is functioning properly.

According to an aspect, there is provided a rigid electrical panel comprising at least a part of an electrical system of a gas turbine engine. The panel comprises a rigid material. The panel comprises a flexible printed circuit at least partly embedded in the rigid material, the flexible printed circuit comprising at least one electrical track arranged to carry electrical signals relating to the operation of the gas turbine engine in use, and at least one integral electromagnetic shield. The panel comprises an electromagnetic protection layer electrically isolated from the flexible printed circuit. The panel comprises a flexible printed circuit outlet terminal to which at least the integral electromagnetic shield is electrically connected. The panel comprises an electrically conductive grounding element to which the electromagnetic protection layer is electrically connected. The flexible printed circuit outlet terminal and the electrically conductive grounding element are electrically isolated. Accordingly, the integral electromagnetic shield can be grounded via the flexible printed circuit outlet terminal and the electromagnetic protection layer can be separately grounded via the electrically conductive grounding element. The integrity of the electromagnetic protection layer and the integrity of the flexible printed circuit and/or the integral electromagnetic shield can be tested independently.

According to an aspect, there is provided a method of manufacturing an electrical panel for an electrical system. The method comprises providing a layer of fibre and resin composite. The method comprises providing an electromagnetic protection layer. The method comprises providing a flexible printed circuit comprising at least one electrical track arranged to carry electrical signals relating to the operation of the gas turbine engine in use, and at least one integral electromagnetic shield. The method further comprises electrically isolating the flexible printed circuit and the electromagnetic protection layer such that the integral electromagnetic shield and the electromagnetic protection layer can be separately grounded and/or tested.

Such a method may comprise providing the electrical panel with any one or more of the additional and/or optional features described and/or claimed herein. For example, the method may comprise electrically connecting the electromagnetic protection layer to an electrically conductive grounding element. The method may comprise electrically connecting the integral magnetic shield to a flexible printed circuit outlet terminal. In such an arrangement, the flexible printed circuit outlet terminal and the electrically conductive grounding element may be electrically isolated.

Arrangements of the present disclosure may allow the integral electromagnetic shield of the flexible printed circuit and the electrically conductive grounding element to be tested independently of each other. Electrical panels according to arrangements of the present disclosure may be said to comprise two independent grounding/earthing systems/routes that are electrically isolated from each other. The safe operation of the two grounding systems/routes may be tested independently.

According to an aspect, there is provided a method of testing the grounding of an electrical system of a gas turbine engine that comprises an electrical panel as described and/or claimed herein. The method comprises testing the grounding provided by the electromagnetic protection layer. The method comprises separately testing the grounding provided by the integral electromagnetic shield. The electromagnetic protection layer may be tested by passing an electrical current therethrough via the electrically conductive grounding element (for example via two electrically conductive grounding elements at either end of the electromagnetic protection layer). The integral electromagnetic shield may be tested by passing an electrical current therethrough via the flexible printed circuit outlet terminal (for example using two flexible printed circuit outlet terminals at either end of the embedded flexible printed circuit).

The or each integral electromagnetic shield in the flexible printed circuit may provide protection (or shielding) to the electrical tracks from electromagnetic interference. The integral electromagnetic shield may provide shielding to high intensity radiated fields (HIRF), such as those produced by radar, TV signals and mobile phone signals, for example. Such an electromagnetic shield may provide a degree of attenuation (or protection) against the effects of a lightning strike, for example providing a degree of protection against the secondary effects of lightning strike, such as cross-talk between electrical tracks/conductors.

The electromagnetic protection layer may provide protection against the effects of lightning strike. The electromagnetic protection layer may protect the flexible printed circuit and/or the electrical tracks therein from the effects of lightning strike. The electromagnetic protection layer and the integral electromagnetic shield may act together to provide sufficient protection to the electrical tracks from the effects of lightning strike. This may have significant weight advantages over providing a single protection layer that would be sufficient to protect the electrical tracks against all possible sources of electromagnetic radiation. It may be important to be able to test both the integral electromagnetic shield and the electromagnetic protection layer independently in order to check that both are functioning correctly in order to ensure that the electrical tracks are sufficiently protected against lightning strike.

Any suitable rigid material may be used. The rigid material may comprise one or more organic matrix composites, which may, for example, be provided in the form of layers. For example the rigid material may comprise a fibre and resin composite. Rigid composite layers may be particularly stiff and/or lightweight. An organic matrix composite may comprise any suitable combination of matrix (or resin) and fibres. For example, any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

Thus, for example, the rigid material may comprise carbon fibre and/or glass fibre. The rigid material may (or may not) comprise more than one different material, for example more than one layer, each having a different material and/or structure. Where the rigid material comprises more than one layer, each having a different material and/or structure, the electromagnetic protection layer may be provided between two layers.

The flexible printed circuit outlet terminal may be at least a part of an electrical connector. At least one electrical track of the flexible printed circuit may be electrically connected to the flexible printed circuit outlet terminal so as to be able to transfer the electrical signal carried by the track in use out of the panel.

The electromagnetic protection layer may be particularly effective in arrangements in which the rigid material of the rigid electrical panel comprises carbon fibre. The speed of an electrical surge resulting (for example) from lightning strike may be particularly low in carbon fibre, meaning that the rigid panel, and in particular the flexible printed circuit embedded in the rigid panel, may be exposed to the effects of the lightning strike for an extended period. Accordingly, the electromagnetic protection layer may be particularly effective in mitigating the otherwise deleterious effects of the increased exposure time in carbon fibre.

The electrically conductive grounding element may be at least a part of a mounting arrangement for mounting the panel to a gas turbine engine. This may mean, for example, that the electrically conductive grounding element is connectable to a component that connects the panel to a gas turbine engine structure and/or that the electrically conductive grounding element itself is connectable to a gas turbine engine structure.

The electrically conductive grounding element may, for example, connect to a gas turbine engine structure via a conductive bond strap. This may be useful if the panel is connectable (or connected) to the rest of the gas turbine engine via an anti-vibration mount.

The flexible printed circuit may comprise at least one layer of electrical tracks. For example, the flexible printed circuit may comprise 1, 2, 3, 4, 5, more than 5, for example more than 10, layers of electrical tracks. Each layer of electrical tracks may comprise at least one electrical track arranged to carry one or more electrical signals, such as those mentioned by way of example elsewhere herein.

The flexible printed circuit may be described as having an upper major surface and a lower major surface. An integral electromagnetic shield may be provided between the or each layer of electrical tracks and both the upper major surface and the lower major surface. Each and every layer of electrical tracks may be provided with an electromagnetic shield between itself and both the upper major surface and the lower major surface. Accordingly, each layer of electrical tracks may be provided with electromagnetic protection from electromagnetic radiation originating from either the side of the upper major surface or the side of the lower major surface. An integral electromagnetic shield may provide electromagnetic protection for one or more than one layer of electrical tracks.

The rigid electrical panel may be described as having an upper surface and a lower surface. The rigid electrical panel may take any suitable form, for example any suitable construction. For example, a part of the panel (which may be a lower portion of the panel towards the lower surface) may comprise a structural region. Such a structural region may comprise fibre and resin composite, such as carbon fibre. Such a structural region may provide most (for example substantially all) of the structural properties of the panel, for example in terms of strength and/or rigidity. In such an arrangement, the electromagnetic protection layer may be provided between the structural region and the flexible printed circuit.

More than one electromagnetic protection layer may be provided in a rigid electrical panel. For example, one electromagnetic protection layer may be provided between the flexible printed circuit and a lower surface of the panel. Additionally or alternatively, another electromagnetic protection layer may be provided between the flexible printed circuit and an upper surface of the panel.

The flexible printed circuit and the electromagnetic protection layer may be separated by an insulator, such as glass fibre for example, which may be provided in any suitable form, such as in the form of plies. The flexible printed circuit may have an insulator, such as glass fibre, on either side, for example next to an upper major surface and next to a lower major surface.

The electromagnetic protection layer may take any suitable form, for example any suitable construction. By way of example, the electromagnetic protection layer may be a conductive mesh. The electromagnetic protection layer may be an expanded metal foil, such as an expanded copper foil, for example. The electromagnetic protection layer may be at least partially (for example partially or fully) embedded in the rigid material of the rigid electrical panel.

One or more rigid electrical panels as described and/or claimed herein may be provided as part of an electrical system. For example, an electrical panel as described and/or claimed herein may be a part of an electrical system for a gas turbine engine. According to an aspect, there is provided a gas turbine engine having an electrical system comprising a rigid electrical panel as described and/or claimed herein. The electrical system of the gas turbine engine may be said to be an electrical harness. Thus, the electrical panel may be said to be a part of an electrical harness of a gas turbine engine. More than one electrical panel such as that described and/or claimed herein may be provided to a gas turbine engine. Where more than one electrical panel is provided, the electrical panels may or may not be connected together.

Such a gas turbine engine having an electrical system comprising electrical panels may have a number of advantages over gas turbine engines with conventional harnesses, as described herein.

Where the electrical panel is provided to a gas turbine engine, it may be mounted to a rigid structure of the gas turbine engine via a mounting element. In that case, the electromagnetic protection layer may be electrically connected to the rigid structure via the mounting element. The electrically conductive grounding element may be, or may be a part of, the mounting element. The electromagnetic protection layer may be grounded to the rigid structure through the mounting element.

An electrical cable may extend from and/or be electrically connected to the flexible printed circuit outlet terminal. The integral electromagnetic shield, and thus the flexible printed circuit, may be grounded through such an electrical cable. The electrical cable may be connected to a rigid structure of the gas turbine engine. For example, the electrical cable may be connected to a different part of the rigid structure to that which the electrically electromagnetic protection layer is electrically connected. A part of the rigid structure to which the electrical cable is attached may be electrically isolated from the part of the rigid structure to that which the electrically electromagnetic protection layer is electrically connected, although this may not be the case. For example, when assembled to an engine, there may be an electrical path from the flexible printed circuit outlet terminal to the electrically conductive grounding element through the structure of the engine.

The integral electromagnetic shield of the flexible printed circuit and the electromagnetic protection layer may be grounded through/to different parts of the rigid structure. The integral electromagnetic shield of the flexible printed circuit may be electrically grounded to a first part of the gas turbine engine structure. The electromagnetic protection layer may be electrically grounded to a second part of the gas turbine engine structure. The first part of the gas turbine engine structure may (or may not) be electrically isolated from the second part of the gas turbine engine structure.

Such arrangements may be particularly convenient for testing safe operation of the electromagnetic protection layer and the integral electromagnetic shield separately from each other.

According to an aspect, there is provided a method of providing an electrical system to a gas turbine engine. The method comprises mounting an electrical panel as described and/or claimed herein to a first part of a rigid structure of a gas turbine engine via a mounting that is electrically connected to the electromagnetic protection layer. The method comprises electrically connecting the flexible printed circuit outlet terminal to a further component of the electrical system. In such an arrangement, the further component may be directly or indirectly electrically connected to a second part of the rigid structure of the gas turbine engine. The further component may be, for example, an electrical cable, such as a flexible electrical cable, that may comprise at least one (for example multiple) electrical conductors. The first and second parts of the rigid structure of the gas turbine engine may (or may not) be electrically isolated.

The electrical panel may comprise (for example have at least partly embedded in the rigid material) at least one conductor that is an electrically conductive wire. Such an electrically conductive wire may be surrounded by an electrically insulating sleeve.

Any given electrical panel may be provided with one or more electrical wires embedded therein (which may be sheathed) and one or more flexible printed circuits embedded therein. As such, a given electrical panel may have wires and flexible printed circuits laid therein.

In any arrangement described and/or claimed herein, the electrical panel may comprise (and/or be provided with) at least one passage in the rigid material. The or each passage may be for passing a fluid therethrough in use. The fluid passage may be part of a fluid system, such as a gas (for example pneumatic or cooling gas/air) and/or liquid (for example a fuel, hydraulic and/or lubricant liquid). Accordingly, the electrical panel may be able both to transmit electrical signals/power and carry fluids, for example around a gas turbine engine. Accordingly, the single panel may be able to replace both fluid pipes and individual electrical wires of conventional fluid and electrical systems of a gas turbine engine.

An electrical panel may be formed in any desired shape, for example in a shape that corresponds to the shape of a casing of a gas turbine engine, such as a fan case, a compressor case, or a turbine case. In this regard, the term "corresponds to" may mean, for example, that the shape of the electrical panel is an offset shape from the shape of the casing.

An electrical panel may be provided in any suitable location/position of a gas turbine engine. For example, the gas turbine engine may comprise a bypass flow duct formed between an engine core and an engine fan casing (the gas turbine engine may be a turbofan engine, for example); and the electrical panel may form at least a part of a radially extending splitter (which may be referred to as a bifurcation) that extends across the bypass flow duct. In this way, an electrical panel (which may be referred to as a splitter electrical panel) may provide an electrical connection between a fan casing and an engine core. As explained elsewhere herein, one or more electrical panels may be attached to the engine core case or engine fan case, for example to a mounting structure on such cases.

The electrical panel may be referred to herein as a rigid electrical panel, an electrical raft, a rigid raft, a rigid panel, a rigid electrical raft or simply as a panel or a raft. These terms may be considered to be interchangeable as used herein, and so, for example, any feature described in relation to an electrical raft, a rigid raft, a rigid electrical raft, a panel or a raft (or assemblies thereof) may, of course, apply to an electrical panel. Furthermore, the panel/raft may be at least a part of an electrical harness for a gas turbine engine, and thus may be referred to herein as an electrical harness raft or electrical harness panel.

In general, transferring electrical signals using the embedded electrical conductors (such as the electrical tracks of the flexible printed circuit) of the electrical panel can provide a number of advantages over transferring electrical signals using a conventional harness. For example, during assembly and in use, such panels may provide greater protection to their electrical conductors than conventional harnesses. Further, the use of such panels may significantly reduce the build and maintenance times of an engine, and/or reduce the possibility of errors occurring during such procedures. The panels can also provide weight and size advantages over conventional harnesses. Similar advantages accrue when fluids are transferred using an embedded fluid system of the rigid panel, for example in the form of fluid passages in the rigid material.

The electrical grounding arrangement described herein may provide protection to the electrical components of the panel (for example electromagnetic protection), and may allow the protection to be tested for reliable operation.

In general, the use of one or more electrical rafts/panels may significantly reduce build time of an engine. For example, use of electrical rafts/panels may significantly reduce the part count involved in engine assembly compared with a conventional harness arrangement. The number and/or complexity of the operations required to assemble an engine (for example to assemble/install an electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical panels/electrical panel assemblies, which themselves may be straightforward to handle, position, secure and connect. Thus, use of electrical rafts/panels in a gas turbine installation may reduce assembly time and/or reduce the possibility of errors occurring during assembly.

Use of electrical rafts/panels may provide significant advantages during maintenance, such as repair and overhaul. As discussed above, the electrical panels may be particularly quick and straightforward to assemble to an engine. The same advantages discussed above in relation to assembly apply to disassembly/removal from the gas turbine engine. Thus, any repair/overhaul that requires removal of at least a part of the electrical harness may be simplified and/or speeded up through use of electrical panels as at least a part of the electrical harness, for example compared with conventional harnesses. Use of electrical panels may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical panel, for example by simply disconnecting it from the engine and any other electrical panels/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical panels and/or electrical panel assemblies prior to engine assembly. This may allow the electrical and/or mechanical operation of the electrical panels to be proven before installation, thereby reducing/eliminating the testing required during engine installation.

The electrical rafts/panels may be a particularly lightweight solution for transferring electrical signals around an engine. For example, an electrical panel may be lighter, for example significantly lighter, than a conventional harness required to transmit a given number of electrical signals. A plurality of conductors may be embedded in a single electrical panel, whereas in a conventional arrangement a large number of heavy, bulky wires, usually with insulating sleeves, would be required. The reduced weight may be particularly advantageous, for example, when used on gas turbine engines on aircraft.

Electrical rafts/panels may be more easily packaged and/or more compact, for example than conventional harnesses. Indeed, as mentioned above, the electrical panels can be made into a very wide range of shapes as desired. This may be achieved, for example, by manufacturing the electrical panels using a mould conforming to the desired shape. As such, each electrical panel may be shaped, for example, to turn through a tighter corner (or smaller bend radius) than a conventional harness. The electrical panels may thus provide a particularly compact solution for transferring electrical signals around a gas turbine engine. The electrical panels may be readily shaped to conform to neighbouring components/regions of a gas turbine engine, for example components/regions to which the particular electrical panel assembly is attached, such as a fan casing or a core casing as noted elsewhere herein.

The electrical panel(s) may provide improved protection to the electrical conductors during manufacture/assembly of the panel/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

It will be appreciated that the embedded electrical conductors (whether they are provided as embedded electrical wires or as conductive tracks in a flexible printed circuit embedded in the rigid material) may be described as being fixed in position by the rigid material, for example relative to the rest of the electrical harness raft/panel. It will also be appreciated that the embedded electrical conductors may be said to be surrounded by the rigid material and/or buried in the rigid material and/or integral with (or integrated into) the rigid material. Similarly, the electromagnetic protection layer may be described as being fixed in position by the rigid material, for example relative to the rest of the electrical harness raft/panel and/or may be said to be surrounded by the rigid material and/or buried in the rigid material and/or integral with (or integrated into) the rigid material.

Other components/systems, for example of a gas turbine engine, may be provided to an electrical panel in any suitable manner. Thus, a surface of an electrical panel may be used as a mounting surface for other gas turbine engine components/systems, such as ancillary/auxiliary components/systems.

For example, an electrical unit may be mounted on an electrical raft/panel. The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). Such an assembly may be a particularly convenient, lightweight and/or compact way of providing (for example attaching, fixing or mounting) an electrical unit to an engine. For example, the electrical unit and the electrical panel may be assembled together (mechanically and/or electrically) before being installed on the gas turbine engine. Such an electrical unit may be connected to the flexible printed circuit outlet terminal, for example.

An electrical raft/panel may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical raft/panel may provide a stable, regular and convenient platform on which to mount the various systems/components. The combination of the installed electrical panel assembly with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft/panel (and thus to the engine) as required. For example, fluid pipes for transferring fluid around the engine may be mounted to the electrical rafts/panels (for example mechanically mounted using a bracket), and thus to the engine. More than one set of fluid pipes, for example for carrying different or the same fluids, may be mounted on the same electrical raft/panel.

An anti-vibration mount may be used to attach an electrical raft/panel to another component, thereby allowing the electrical raft/panel to be vibration isolated (or at least substantially vibration isolated). Purely by way of example, the electrically conductive grounding element may be at least a part of an anti-vibration mount. Using an anti-vibration mount to attach an electrical raft/panel to a gas turbine engine for example may reduce (or substantially eliminate) the amount (for example the amplitude and/or the number/range of frequencies) of vibration being passed to the electrical raft/panel from the gas turbine engine, for example during use. This may help to prolong the life of the electrical raft/panel. Furthermore, any other components that may be attached to the electrical raft/panel (as discussed above and elsewhere herein) may also benefit from being mounted to the gas turbine engine via the anti-vibration mounts, through being mounted on the electrical raft/panel. For example, the reduced vibration may help to preserve the electrical contact between the electrical raft/panel and any electrical unit connected thereto. As such, any components (such as an electrical unit mounted to the electrical panel) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft/panel (for example to a mounting surface of the electrical panel), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

In use, the electrical signals transferred by the conductors in the electrical raft/panel, and around the engine where the panel is used as part of an electrical harness of a gas turbine engine, may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft/panel may be used to transfer/communicate any possible combination of electrical signals in any part of a gas turbine engine installation or a related (for example electrically and/or mechanically connected) structure/component/system.

BRIEF DESCRIPTION OF THE DRAWINGS

Examples of the disclosure will now be described by way of non-limitative example with reference to the accompanying drawings in which.

DETAILED DESCRIPTION OF EMBODIMENTS

Figure 2:
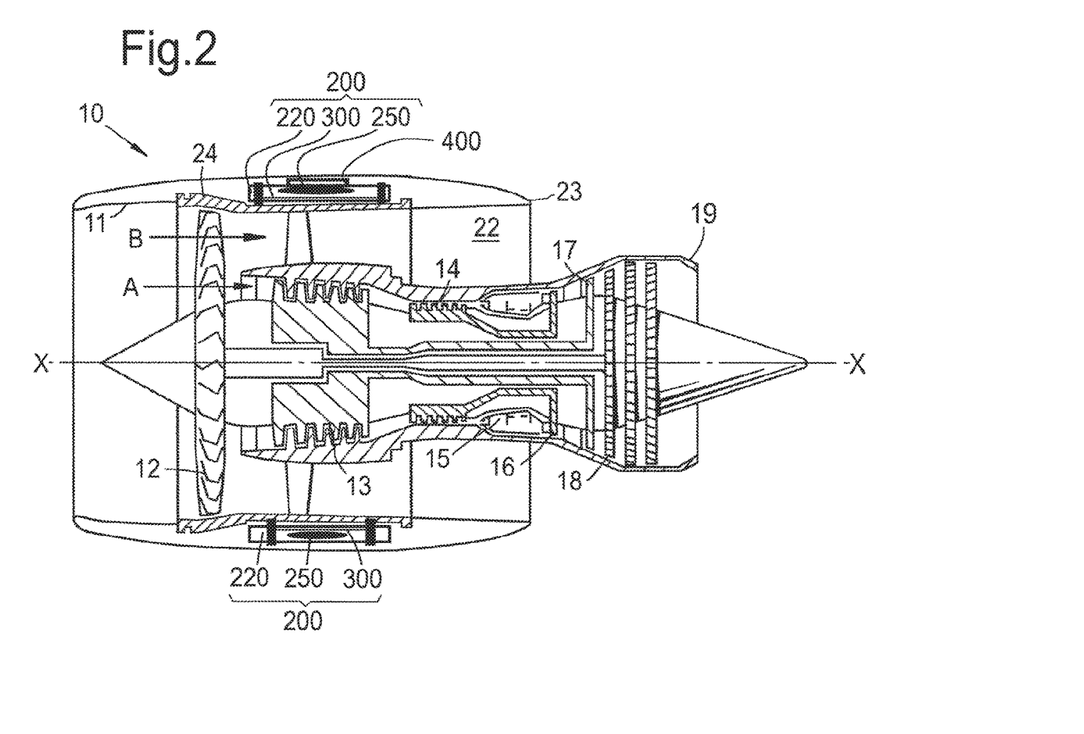
FIG. 2 shows a cross-section through a gas turbine engine having electrical panels in accordance with the present disclosure.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 shows two electrical panels 200 according to examples of the disclosure. As such, the gas turbine engine 10 is in accordance with the present disclosure. The electrical panels 200 may be rigid electrical panels 200. The electrical panels 200 may be used to transmit/transfer electrical signals (or electricity, including electrical power and/or electrical control signals) around the engine and/or to/from the engine 10 from other components, such as components of an airframe. The function and/or construction of each electrical panel 200 may be as described and/or claimed herein.

Figure 3:
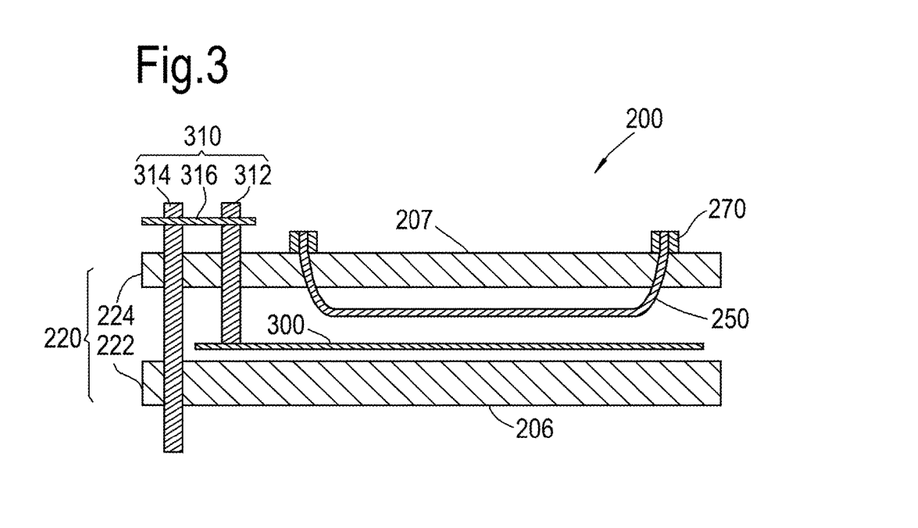
FIG. 3 shows a schematic cross sectional view through an electrical panel in accordance with the present disclosure.
Figure 4:
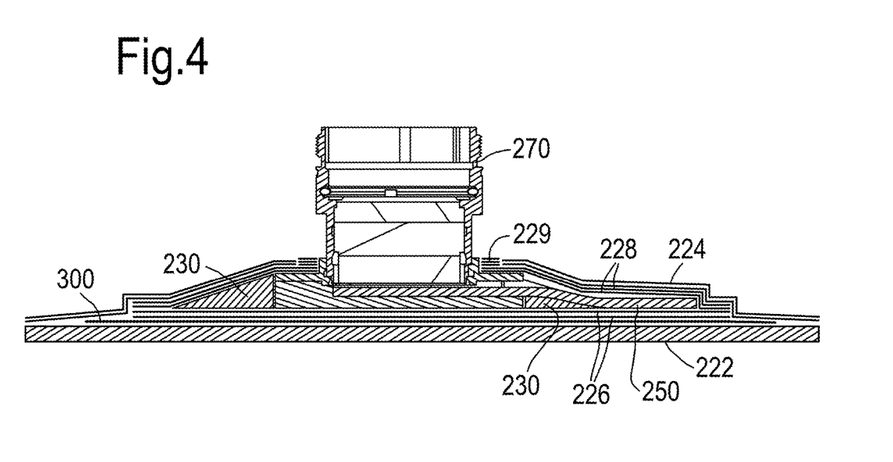
FIG. 4 shows another schematic cross sectional view through an electrical panel in accordance with the present disclosure.

The electrical panel 200 comprises a rigid material 220, a flexible printed circuit 250, and an electromagnetic protection layer 300. FIGS. 3 and 4 provide further exemplary details of the electrical panel 200.

As shown in FIG. 3, which is purely schematic to aid understanding of the disclosure, the electrical panel 200 has an electromagnetic protection layer 300 embedded in the rigid material 220. The electromagnetic protection layer 300 is connected to a mount 310. The mount 310 may be used to connect the electrical panel 200 to another structure, such as a part of a gas turbine engine, such as a casing. The mount 310 may be electrically conductive and is an example of at least a part of an electrically conductive grounding element 310 to which the electromagnetic protection layer 300 is electrically connected.

The electromagnetic protection layer 300 may comprise any suitable material (such as a conductive material, such as metal, for example copper), and be over any suitable form (such as a foil, mesh, or continuous layer).

The mount 310 is shown schematically and is purely exemplary of many different configurations and arrangements that an electrically conductive grounding element 310 may take. As in the FIG. 3 example, the mount 310 may comprise a stud 312 that is electrically connected to a mounting fixture 314 via a bond strap 316. The bond strap 316 may be an electrically conductive wire, for example. This is an example of an arrangement by which the electromagnetic protection layer 300 may be grounded via the mount 310, for example to the structure (such as a gas turbine engine structure, for example casing) to which the mount 310 is connected/attached (for example directly connected/attached).

The electrical panel 200 shown in FIG. 3 also has a flexible printed circuit 250 embedded in the rigid material 200. The electrical panel 200 may be a thin structure having a first major surface 207 separated by a thickness from a second major surface 206, as in the FIG. 3 example. The flexible printed circuit 250 and the electromagnetic protection layer 300 may be said to be embedded between the first major surface 207 and the second major surface 206. The flexible printed circuit 250 is connected to a flexible printed circuit outlet terminal 270. The flexible printed circuit outlet terminal 270 may provide electrical connection to connect the flexible printed circuit 250 to electrical components outside the electrical panel 200, for example outside the rigid material 220. An example of a flexible printed circuit outlet terminal 270 is shown in greater detail in FIG. 4, and an example of a flexible printed circuit 250 is shown in greater detail in relation to FIG. 5.

Figure 5:
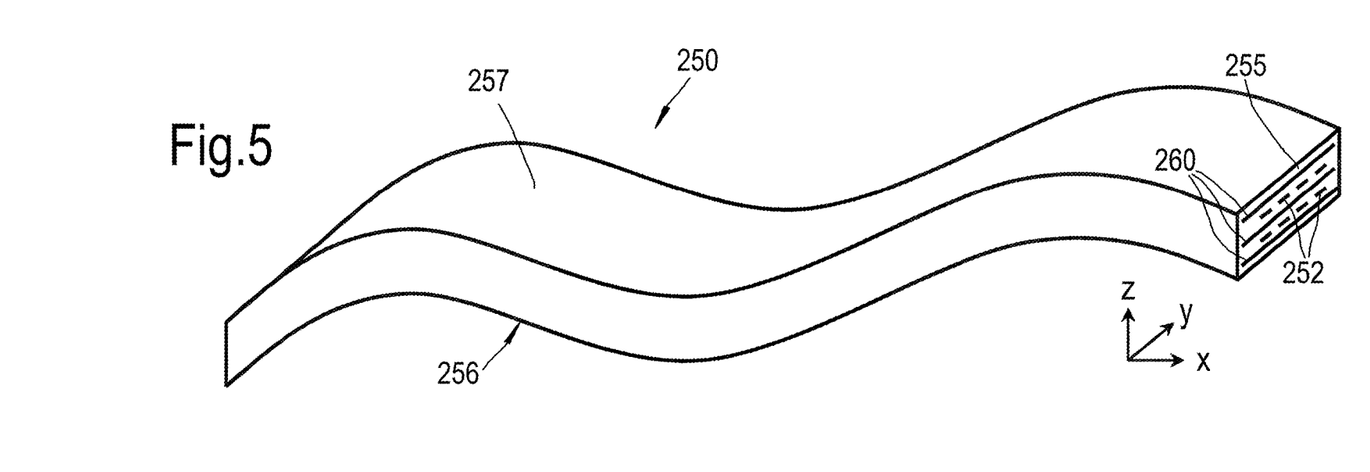
FIG. 5 shows a schematic perspective view of a flexible printed circuit.

The flexible printed circuit 250 may comprise at least one electrical track 252, for example at least one layer of electrical tracks 252 as shown in the FIG. 5 example. The flexible printed circuit also comprises at least one integral electromagnetic shield 260, as shown in the FIG. 5 example. The flexible printed circuit 250 may be a thin body (in the z-direction shown in FIGS. 5 and 6) of generally elongate form (extending in the x-direction in FIGS. 5 and 6), having an upper major surface 257 and a lower major surface 256 separated by a thickness (in the z-direction). The flexible printed circuit 250 may have an integral electromagnetic shield 260 adjacent one or both of the upper major surface 257 and the lower major surface 256. Each electrical track 252 may have at least one integral electromagnetic shield 260 between itself and one or both of the upper major surface 257 and the lower major surface 256.

Figure 6:
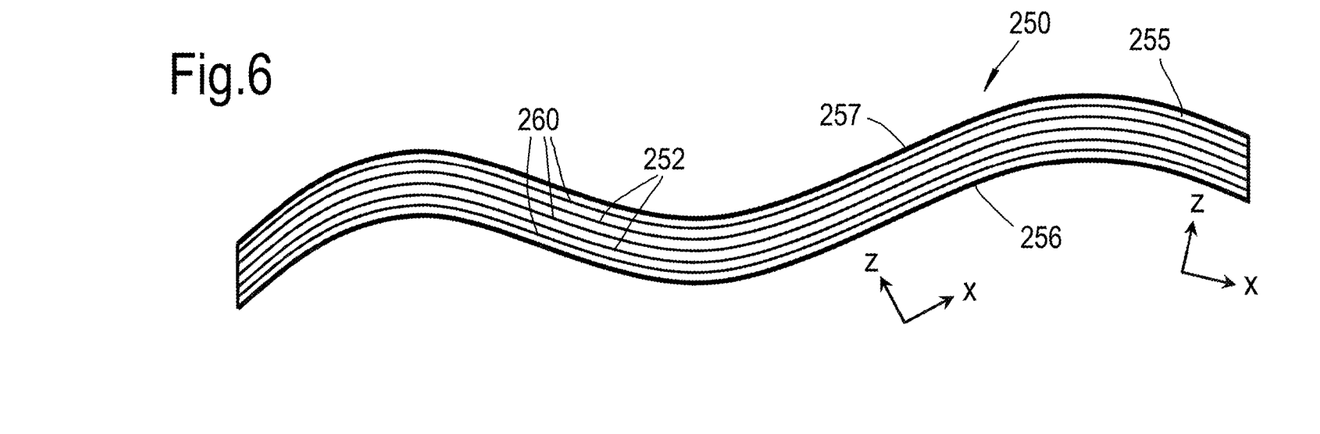
FIG. 6 shows a cross-section through the flexible printed circuit shown in FIG. 5.

The flexible printed circuit may have any suitable number of integral electromagnetic shields. Each electromagnetic shield may be a conductive layer, such as a metallic layer, for example copper or tin-plated copper. The electromagnetic shield may take any suitable form, for example a continuous (or solid) layer or a mesh structure. In the example of FIGS. 5 and 6, alternate layers of electrical tracks 252 and integral electromagnetic shield 260 are provided, but any other suitable arrangement may be used. For example, two, three, four, five or more than five layers of electrical tracks 252 may be provided between each electromagnetic shield 260. Some arrangements may only have an electromagnetic shield 260 adjacent one or both of the upper major surface 257 and the lower major surface 256.

The electromagnetic protection layer 300 and the flexible printed circuit 250 (at least the electrical conductors/tracks 252 thereof) are electrically isolated within the panel 200. An insulating material 226 may be provided between the electromagnetic protection layer 300 and the flexible printed circuit 250 to achieve electrical isolation, as shown by way of example in FIG. 4. Purely by way of example, the insulating material may be glass fibre, for example one or more layers of glass fibre plies.

The flexible printed circuit outlet terminal 270 may, for example, be any type of electrical connector and/or may have terminals that are electrically connected to electrical tracks 252 of the flexible printed circuit 250. The flexible printed circuit outlet terminal 270 may be connected to another part of an electrical system, such as an electrical cable and/or an electrical unit.

The rigid material 220 may comprise one or more different materials, for example one or more different layers of material. The rigid material may comprise a structural layer 222 which may provide the majority of the mechanical strength and/or stiffness to the electrical panel 200. The structural layer 222 may provide all of the mechanical properties (for example in terms of strength and/or stiffness) that the electrical panel requires. Such a structural layer 222 may be any suitable material, such as carbon fibre. The insulating material 226 discussed above may also be said to be part of the rigid material 220. Further insulating material 228, 229 may be provided around the flexible printed circuit outlet terminal 270 and/or on the other side of the flexible printed circuit 250 to that which the insulating material 226 is provided. Thus, for example, the flexible printed circuit 250 may have a layer of insulating material 226, 228 provided adjacent both of its major surfaces. The insulating material/layers 226, 228, 229 may all be said to be part of the rigid material 220. The electrical panel 220 may further comprise an additional layer 224 forming the opposite major surface to that of the structural layer 222. A purpose of such an additional layer 224 may cover the interior of the electrical panel 200, and so it may be referred to as a cosmetic layer 224. Such a cosmetic layer 224 (where present) may be said to be part of the rigid material 220. The cosmetic layer 224 may be manufactured using any suitable material, such as carbon fibre or a polymer. A cosmetic layer 224 may be thinner and/or comprise fewer plies than a structural layer 222.

The electrical panel 200 may also comprise a collar 230 that surrounds the base of the flexible printed circuit outlet terminal 270. Such a collar 230 may be embedded in the rigid material 220. The collar 230 may provide electrical isolation for the flexible printed circuit outlet terminal 270 and/or may simplify the manufacturing process, for example by providing a smooth surface around the flexible printed circuit outlet terminal 270 over which any cosmetic plies/layers 224 may be laid.

The flexible printed circuit outlet terminal 270 and the electrically conductive grounding element 310 are electrically isolated in the panel 200. Accordingly, the flexible printed circuit 250, the flexible printed circuit outlet terminal 270 and any components connected thereto may be grounded (or earthed) by one grounding path, whereas the electrically conductive grounding element 310, the electromagnetic protection layer 300 and any components electrically connected thereto may be grounded (or earthed) by a different grounding path. The different grounding (or earthing) paths may function and be tested independently of each other.

Purely by way of example, the casing of electrical boxes, such as EECs, may be connected to, and thus earthed via, the electromagnetic protection layer 300. Any electrical components inside such an electrical box may be electrically connected to the electrical box, and thus may also be earthed via, the electromagnetic protection layer 300.

Returning again to FIGS. 5 and 6, the flexible printed circuit (or FPC) 250 may comprise a flexible (for example elastically deformable) substrate 255 in which the conductive tracks 252 and integral electromagnetic shield 260 are laid/formed. The FPC 250 may thus be deformable. The FPC 250 may be described as a thin, elongate member and/or as a sheet-like member.

The flexible substrate 255 may be a dielectric. The substrate material may be, by way of example only, polyamide. As will be readily apparent, other suitable substrate material could alternatively be used.

The conductive tracks 252 and/or the integral electromagnetic shield 260, which may be said to be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the electrical panel 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

Where the rigid material 220 comprises composite layers, the composite layers may take any suitable form and/or construction. For example, the composite layers may each comprise one or more ply layers (or plies) of resin and fibres.

Such a fibre and resin compound may, after suitable treatment (for example curing, such as heat treatment), produce the rigid composite material 220. The fibres in one ply layer may extend in a different direction to those of another ply layer. For example fibres in one play layer may extend perpendicularly or at 30 degrees, 45 degrees or 60 degrees to fibres in another ply layer directions. The fibres may be pre-impregnated (or "pre-pregged") with the resin.

Any suitable method could be used to produce the rigid material 220 of the electrical panel 200. For example, the strands/fibres of organic matrix composite layers need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method.

Figure 7:
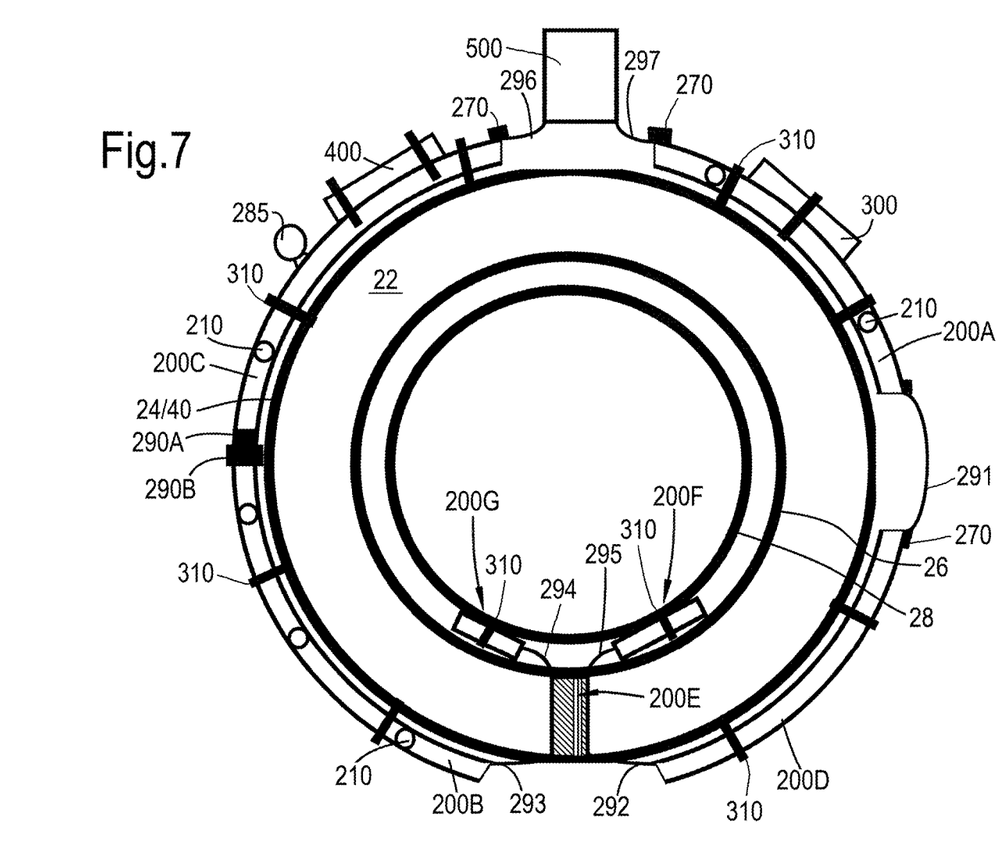
FIG. 7 shows a cross-section normal to the axial direction through a gas turbine engine having electrical panels in accordance with the present disclosure.

The electrical panel 200 may comprise additional components and/or parts, for example components/parts that might form part of a conventional engine dressing. Such components may, for example, comprise parts of fluid and/or electrical systems of a gas turbine engine, such as one or more fluid passages and/or one or more electrical connectors. Schematic examples of electrical panels 200 comprising fluid passages 210 are shown in FIG. 7, described in greater detail below. Such fluid passages 210 may carry any type of fluid, such as any of the fluids described elsewhere herein by way of example. The fluid passages 210 may form part of fluid systems of a gas turbine engine, for example. Fluid passages 210 may be formed in any suitable manner, for example by laying plies of composite around embedded pipes.

FIG. 7 is a schematic showing a cross-section perpendicular to the direction X-X of a gas turbine engine comprising electrical panels 200A-200G. Any one of the electrical panels 200A-200G may comprise any or all of the features of an electrical panel 200 as described and/or claimed herein, for example. Thus, for example, any one of the electrical panels 200A-200G may comprise a rigid material 220, a flexible printed circuit 250 having electrical tracks 252 and integral electromagnetic shield 260, an electromagnetic protection layer 300, a flexible printed circuit outlet terminal 270 and an electrically conductive grounding element 310. The detailed construction of the electrical panels 200 is not shown in FIG. 7 for simplicity.

The electrical panels 200A-200D are mounted to a fan case 24, the electrical panel 200E is part of a bifurcation splitter that radially crosses a bypass duct 22, and the electrical panels 200F, 200G are mounted to an engine core case 28. However, it will be appreciated that an electrical panel 200 could be mounted in any suitable and/or desired location on a gas turbine engine 10.

In FIG. 7, two electrical panels 200A, 200C are shown as having an electrical unit 400 mounted thereon. However, any (or none) of the electrical panels 200A-200G may have an electrical unit 400 mounted thereon. Where an electrical unit 400 is mounted on an electrical panel 200, it may be in electrical contact with the electromagnetic protection layer 300, for example by being mounted directly onto the electromagnetic protection layer 300 (not shown in FIG. 7).

As mentioned herein, each of the electrical panels 200 shown in FIG. 7 comprises one or more electrical conductors 252 embedded therein. However, any one or more of the electrical panels 200 may be replaced with a panel that does not comprise electrical conductors 252. Such a panel (or raft) would not be an electrical panel 200, but may otherwise be as described elsewhere herein, for example it may be a rigid panel that may have components/systems (such as, by way of example only, fluid systems, such as pipes) mounted thereon and/or embedded therein. Thus, for example, a gas turbine engine in accordance with the present invention may have a combination of electrical panels 200 and non-electrical panels.

The arrangement of electrical panels 200A-200G shown in FIG. 7 is by way of example only. Alternative arrangements, for example in terms of number, size, shape and/or positioning, of electrical panels 200A-200G may be used. For example, there need not be seven electrical panels 200, the panels may or may not be connected together, and the panels could be provided to (for example mounted on) any one or more components of the gas turbine engine 10. Purely by way of example only, connection between electrical panels 200A-200D mounted on the fan casing 24 to the electrical panels 200F, 200G mounted on the core casing 28 may be provided at least in part by means other than an additional electrical panel 200E, for example using wire conductors with insulating sleeves. By way of further example, one or more electrical panels 200 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

As noted above, any one or more of the electrical panels 200A-200G may have a fluid passage 210 embedded therein and/or provided thereto. The fluid passage 210 may be part of a fluid system, such as a gas (for example pneumatic or cooling gas/air) and/or liquid (for example a fuel, hydraulic and/or lubricant liquid). In the FIG. 7 example, three of the electrical panels 200A-200C comprise a fluid passage 210 at least partially embedded therein. The electrical panel 200C also has a fluid passage 285 (which may be for any fluid, such as those listed above in relation to embedded passage 210) mounted thereon. Such a mounted fluid passage 285 may be provided to any electrical panel 200, such as those shown in FIG. 7. The fluid passages 210, 285 shown in FIG. 7 may be oriented in an axial direction of the engine 10. However, fluid passages 210, 285 may be oriented in any direction, for example axial, radial, circumferential or a combination thereof.

Any of the electrical panels 200A-200G may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 7, and described below, but other connectors may be used. For example, electrical panels 200 (and/or non-electrical panels) may be connected together (or to other components) using any combination of electrical, fluid and/or mechanical connectors. Thus, any of the connections 290A/290B, 291-297 shown in FIG. 7 may be any combination of electrical, fluid and/or mechanical connection. Alternatively, electrical panels 200 (and/or non-electrical panels) may be standalone, and thus may have no connection to other panels or components. Any one or more of the connections from any of the electrical panels 200A-200G may be via a flexible printed circuit outlet terminal 270, such as described and/or claimed herein.

A connection 291 is shown between the electrical panels 200A and 200D, and this connection may be via a flexible printed circuit outlet terminal 270. The connection 291 may comprise an electrical connection. Such an electrical connection may be flexible and may, for example, take the form of a flexible printed circuit such as the flexible printed circuit 250 shown in FIGS. 5 and 6. Such a flexible electrical connection may be used to electrically connect any electrical panel 200 to any other component, such as another electrical panel 200. A connection 297 (which may be or comprise an electrical connection) is provided between the electrical panel 200A and a part of an airframe, or airframe installation 500, which may, for example, be a pylon. Similarly, a fluid and/or mechanical connection 296 may additionally or alternatively be provided between the airframe 500 and another electrical panel 200C. As shown in FIG. 7, other electrical and/or fluid connections 292, 293, 294, 295 may be provided between electrical panels 200 and other components, such as other electrical panels 200.

A direct connection 290A, 290B may be provided, as shown for example between the electrical panels 200B, 200C. Such a direct connection 290A, 290B may comprise a connector 290A provided on (for example embedded in) one electrical panel 200 connected to a complimentary connector 290B provided on (for example embedded in) another electrical panel 200. Such a direct connection 290A, 290B may, for example, provide fluid and/or electrical connection between the two electrical panels 200B, 200C. Such direct connectors 290A, 290B may be electrically connected to an embedded FPC 250, and may be examples of a flexible printed circuit outlet terminal 270.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term "gas turbine engine" as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical panels 200 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the scope of the invention.

For example, it will be appreciated that many alternative configurations and/or arrangements of electrical panels 200 and gas turbine engines 10 comprising electrical panels 200 other than those described herein may fall within the scope of the invention. For example, alternative arrangements of electrical panels 200 (for example in terms of the arrangement, including number/shape/positioning/constructions, of mounting fixtures, the arrangement/shape/positioning/construction of the electrical panels 200, the type and/or positioning of components (if any) mounted to/embedded in the electrical panels 200, the rigid material 220 and the electrical conductors 252) may fall within the scope of the invention and may be readily apparent to the skilled person from the disclosure provided herein. Alternative arrangements of connections (for example mechanical, electrical and/or fluid) between the electrical (or non-electrical) panels and/or assemblies thereof and between the electrical (or non-electrical) panels and/or assemblies thereof and other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. A rigid electrical panel comprising at least a part of an electrical system of a gas turbine engine, the panel comprising:
    a rigid material;
    a flexible printed circuit at least partly embedded in the rigid material, the flexible printed circuit comprising at least one electrical track arranged to carry electrical signals relating to the operation of the gas turbine engine in use, and at least one integral electromagnetic shield;
    an electromagnetic protection layer electrically isolated from the flexible printed circuit the electromagnetic protection layer embedded in the rigid material:
    a flexible printed circuit outlet terminal to which at least the integral electromagnetic shield is electrically connected; and
    an electrically conductive grounding element to which the electromagnetic protection layer is electrically connected, wherein
    the flexible printed circuit outlet terminal and the electrically conductive grounding element are electrically isolated, such that the integral electromagnetic shield is grounded via the flexible printed circuit outlet terminal and the electromagnetic protection layer is separately grounded via the electrically conductive grounding element.

2. The rigid electrical panel according to claim 1, wherein the rigid material comprises a fiber and resin composite.

3. The rigid electrical panel according to claim 1, wherein:
    the flexible printed circuit outlet terminal is at least a part of an electrical connector; and
    at least one electrical track of the flexible printed circuit is electrically connected to the flexible printed circuit outlet terminal so as to be able to transfer the electrical signal carried by the track in use out of the panel.

4. The rigid electrical panel according to claim 1, wherein the electrically conductive grounding element is at least a part of a mounting arrangement for mounting the panel to the gas turbine engine.

5. The rigid electrical panel according to claim 1, wherein:
    the flexible printed circuit comprises at least one layer of electrical tracks;
    the flexible printed circuit has an upper major surface and a lower major surface; and
    an integral electromagnetic shield is provided between the or each layer of electrical tracks and both the upper major surface and the lower major surface.

6. The rigid electrical panel according to claim 1, wherein:
    the panel has an upper surface and a lower surface;
    a lower portion of the panel towards the lower surface comprises a structural fiber and resin composite region; and
    the electromagnetic protection layer is provided between the structural fiber and resin composite region and the flexible printed circuit.

7. The rigid electrical panel according to claim 1, wherein the flexible printed circuit and the electromagnetic protection layer are separated by glass fiber.

8. The rigid electrical panel according to claim 1, wherein the electromagnetic protection layer is a conductive mesh.

9. The rigid electrical panel according to claim 1, wherein the electromagnetic protection layer is an expanded metal foil.

10. The rigid electrical panel according to claim 1, wherein:
    the rigid material comprises carbon fiber; and
    the flexible printed circuit outlet terminal is electrically isolated from the carbon fiber.

11. The gas turbine engine having an electrical system comprising the rigid electrical panel according to claim 1.

12. A method of providing an electrical system to a gas turbine engine comprising:
    mounting an electrical panel according to claim 1 to a first part of a rigid structure of a gas turbine engine via a mounting that is electrically connected to the electromagnetic protection layer; and electrically connecting the flexible printed circuit outlet terminal to a further component of the electrical system, the further component being directly or indirectly electrically connected to a second part of the rigid structure of the gas turbine engine.

13. A method of testing the grounding of an electrical system of a gas turbine engine that comprises the electrical panel of claim 1, the method comprising:

testing the grounding provided by the electromagnetic protection layer; and separately testing the grounding provided by the integral electromagnetic shield.

14. The gas turbine engine according to claim 11, wherein:

the electrical panel is mounted to a rigid structure of the gas turbine engine via a mounting element; and the electromagnetic protection layer is electrically connected to the rigid structure via the mounting element.

15. The gas turbine engine according to claim 14, wherein:

an electrical cable extends from and is electrically connected to the flexible printed circuit outlet terminal; and the electrical cable is electrically connected to a different part of the rigid structure to that which the electromagnetic protection layer is electrically connected.

\* \* \* \* \*